Nov. 4, 1969 R. J. WALSH 3,475,867
PROCESSING OF SEMICONDUCTOR WAFERS
Filed Sept. 18, 1967 2 Sheets-Sheet 1
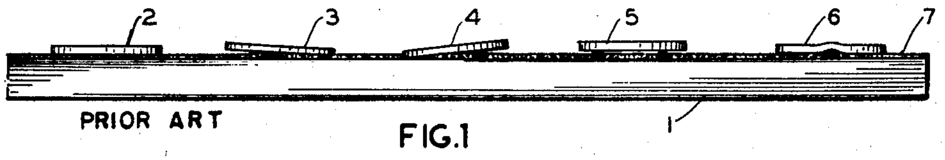
PRIOR ART
FIG. 1
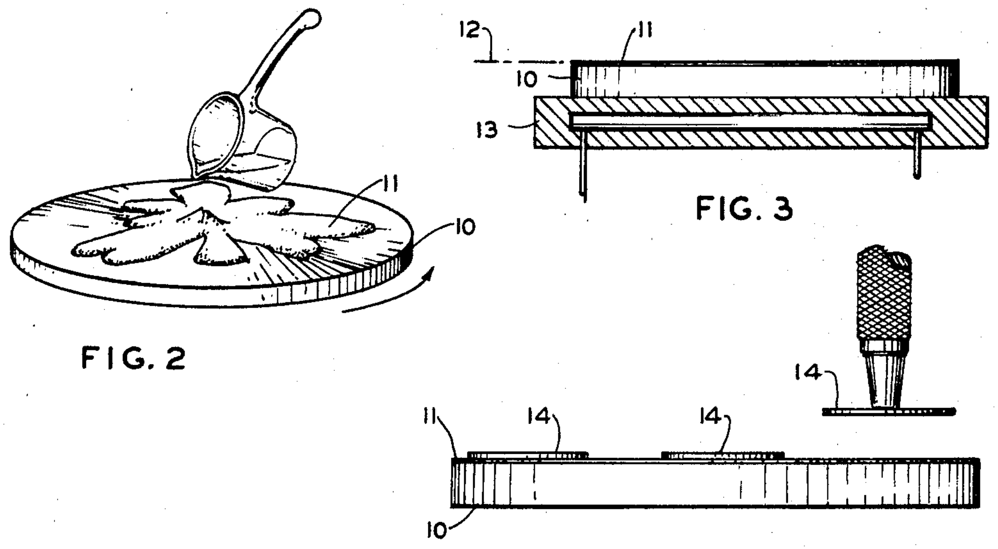
FIG. 2, FIG. 3
FIG. 4
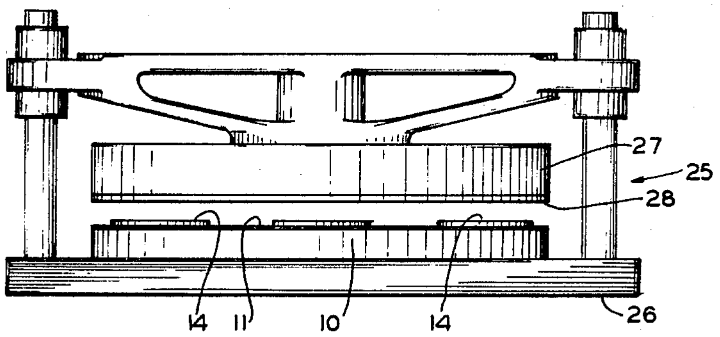
FIG. 5
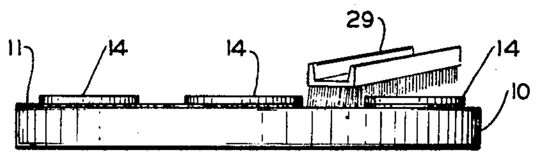
FIG. 6
INVENTOR
ROBERT J. WALSH
BY
Robert J. Schaap
ATTORNEY INVENTOR
ROBERT J. WALSH
BY
Robert J. Schaap
ATTORNEY

United States Patent Office 3,475,867

Patented Nov. 4, 1969

3,475,867

PROCESSING OF SEMICONDUCTOR WAFERS

Robert J. Walsh, Ballwin, Mo., assignor to Monsanto Company, St. Louis, Mo., a corporation of Delaware Continuation-in-part of application Ser. No. 603,336, Dec. 20, 1966. This application Sept. 18, 1967, Ser. No. 668,546

Int. Cl. B24b *1/00, 19/00;* B05b *13/02*

U.S. Cl. 51—281 15 Claims

ABSTRACT OF THE DISCLOSURE

The method of mounting semiconductor slices on a carrier for further processing wherein a wax coating is applied to a rotating carrier to cause the wax to spread out uniformly over the entire surface. The wax is heated to a temperature where it is sufficiently tacky to enable the semiconductor slice to be pressed against the wax surface and temporarily bonded thereto. By rotating the plate at a selected speed, a uniform distribution of wax across the entire surface of the carrier is attained. Furthermore, the wax coating is sufficiently thick that it provides a new reference plane and is also capable of accommodating any foreign particles which may be pressed into the wax layer.

This application is a continuation-in-part of my copending application Ser. No. 603,336, filed Dec. 20, 1966, now abandoned.

This invention relates in general to certain new and useful improvements in the processing of semiconductor slices, and more particularly to a method for the precision mounting of semiconductor slices on a carrier for the performing of mechanical operations thereon.

In recent years, semiconductor devices such as silicon controlled rectifiers have found widespread use in the electronics industry. These semiconductor devices are made from semiconductor materials which may have a plurality of layers of semiconductor material having different conductivities and separated by a transition zone. Semiconductor materials of this type having at least two layers of different conductivities with a transition region therebetween are very suitable for use in the formation of electronic members such as diodes, transistors, switches and similar types of electronic structures. One very effective method of producing semiconductor materials is by the epitaxial deposition of silicon on a substrate wafer formed of like material. Generally, the wafers involved must be formed of single crystal silicon with precisely controlled concentrations of doping impurities.

Epitaxial layers are usually grown by heating the silicon substrate wafer in an atmosphere containing hydrogen and the vapor of a volatile silicon compound such as trichlorosilane or silicon tetrachloride along with minute traces of compounds of Group III or Group V doping elements such as boron or phosphorus often in the form of their halides or hydrides.

The substrate wafers are usually cut by diamond sawing single crystal silicon rods of carefully controlled chemical purity which have been grown by the Czochralski or float zone techniques. In order to grow single crystal epitaxial layers of good structure, it is first necessary to carefully prepare the substrate wafer in order to remove that portion of crystal surface which was structurally damaged in the sawing operation. This is conveniently done by removing about 2–3 mils of material from the wafer surface in lapping and polishing operations such as those described in U.S. Patent No. 3,170,273.

It is common practice to mount a number of semiconductor slices on a metal carrier by means of a thermoplastic wax for processing of the slices through the steps of lapping and polishing in order to eliminate the manual treatment of each slice on an individual basis.

In addition to the high degree of surface perfection required on epitaxial substrate wafers, it is also usually necessary to control the wafer thickness to close tolerances. Typically, the thickness variation across a wafer must be controlled within ±0.00025 inch or less and the center thickness variation from wafer to wafer must be controlled within ±0.0005 inch or less.

In order to achieve this close control of dimensional tolerances on a number of slices lapped and polished together on a carrier, it is essential that the slices be mounted with their surfaces substantially parallel to one another. It is also essential that the thickness of the mounting wax layer be uniform from slice to slice so that all of the slices are substantially equidistant from the reference plane provided by the surface of the carrier plate.

A number of problems are encountered in attempting to meet these requirements by the prior art method of mounting, which consists of (1) heating the carrier above the melting point of the wax, (2) forming molten pools of wax on the carrier plate at the desired slice mounting positions, (3) placing the wafer slices on the wax pools, (4) pressing the slices to squeeze excess wax out from under the slices, and (5) cooling the carrier to solidify the wax.

By having the wax at a temperature such that it is in a readily flowable state and by using sufficient pressure on the wafer surface to force substantially all of the wax from underneath the wafer leaving only sufficient wax to bind the wafer to the surface of the carrier plate, it is theoretically possible to secure substantially perfect alignment of the bottom face of the wafer with the reference plane provided by the surface of the carrier plate. It has been found, however, that this is only possible in theory because dust particles which are inevitably present have such a diameter that even a single dust particle on the wafer surface or in the wax underneath the wafer will cause such misalignment or distortion as to materially detract from the usefulness of wafer.

As a result of particulate contamination, poor thickness uniformity between the slices resulted because of the variable spacing of the slices from the carrier reference surface. Furthermore, poor parallelism or thickness uniformity within a particular slice also resulted for the same reason. In addition to this problem, dimples and waviness in the polished surfaces of the wafer may be caused by deformation of the slice around the particulate matter. Scratching and mechanical damage to the bottom surface of the slices often resulted from abrasive particles. The defects resulting from this particulate contamination oftentimes caused a high discard percentage of treated wafers which was very costly.

In addition to these problems, it is not possible to press the wafer only partially into the puddle of wax leaving a thickness of wax sufficient to accommodate dust particles because of variations in the thickness of the several wafers which are desirably mounted upon a single carrier plate and because of variations in the thickness of individual wafers. In other words, if one attempts to employ the surface of a press plate as a reference plane for alignment of the wafers, the bottom surfaces of the wafers will be at varying distances from the surface of the carrier plate and in many instances the surface of the wafer embedded in the wax will not be parallel to the surface of the carrier plate so that variations and imperfections in the thicknesses of the wafers created in the slicing operation are to a large extent not removed during the polishing operation.

In accordance with this invention, it has been found that one need not employ the surface of the carrier plate as a reference plane for alignment of the wafer surfaces. Instead, one uses the surface of an adhesive wax layer applied in a manner to be subsequently described as the reference plane for alignment of the surfaces of the wafers to be polished and no effort is made to minimize the distance between the bottom surface of the wafers and the surface of the carrier plate. To the contrary, the wax layer is deliberately made of a thickness at least in excess of the diameter of the usual dust particle and is provided with the consistency at the time the wafers are brought into contact therewith that there is practically no deformation of the wax surface by the wafer. In other words, the wafer rests upon the wax surface and is not pressed into the wax surface to any substantial extent. However, the consistency of the wax layer is such that any dust particles which may be upon the surface of the wax or which might be upon the surface of the wafer which is to be applied to the wax are pressed into the wax layer so that the wafer rests in full contact with the wax surface and is under substantially no strain as a result of unevenness generated by dust particles on the reference surface.

It is, therefore, the primary object of the present invention to provide a method of mounting semiconductor slices on a carrier for further processing which eliminates deleterious effects of particulate contamination in a mounting layer.

It is another object of the present invention to provide a method for the precision mounting of semiconductor slices on a carrier in preparation for lapping and polishing to close dimensional tolerances.

It is a further object of the present invention to provide a method of the type stated which permits precise spacing of the wafer slices from the carrier reference surface and which, therefore, permits close thickness uniformity within and between each of the wafer slices on the carrier.

It is an additional object of the present invention to provide a method for the processing of semiconductor slices of the type stated which includes a technique for attaining even wax distribution on the carrier surface.

It is also an object of the present invention to provide a method of the type stated which enables a plurality of semiconductor wafer slices to be treated on a mass-production basis and with a minimum of manual operation.

With the above and other objects in view, my invention resides in the novel features of form, construction, arrangement and combination of parts presently described and pointed out in the claims.

In the accompanying drawings:

FIGURE 1 is an enlarged side elevation view showing the prior art method of mounting a plurality of wafer slices on a carrier;

FIGURE 2 is a perspective view illustrating the operation of depositing a wax layer on the carrier and simultaneously rotating the carrier;

FIGURE 3 is a schematic side elevational view of the wafer support plate on a conventional heater and illustrating the steps of air drying the wax permitting the solvent therein to evaporate and heating the carrier to drive off the last traces of solvent and to soften the wax in preparation for mounting the wafer slices;

FIGURE 4 is a schematic side elevational view illustrating the step of placing wafer slices in the softened wax coating;

FIGURE 5 is a schematic side elevational view of a conventional press and illustrating the method of pressing the wafer slices into the wax coating;

FIGURE 6 is a schematic side elevational view illustrating the method of removing the excess wax from the surface of the wafer support plate;

General description

Figure 7:
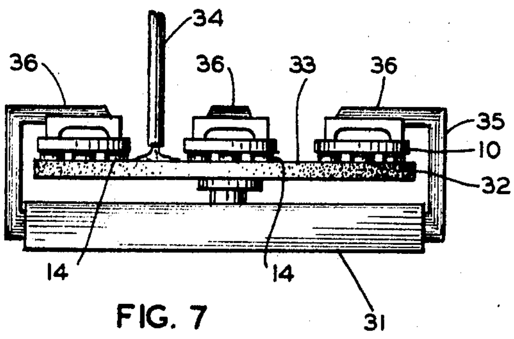
FIGURE 7 is a schematic side elevational view of a conventional lapping device and illustrating the method of lapping the wafers of the present invention.

Generally speaking, the present invention relates to a process for the mounting of semiconductor slices and processing the semiconductor slices while they are disposed on the carrier. A suitable wax with a broad softening range such as gum rosin is dissolved in a suitable volatile solvent and the dissolved wax is poured onto the center of a rotating carrier plate. The plate is rotated at a speed which is sufficient to cause the wax to spread out over the entire surface of the carrier plate with a substantially uniform thickness. The speed of rotation of the carrier plate must be considered as a function of the type of wax used and the concentration of wax in the solution which determines the viscosity of the solution. As the plate rotates, the wax solution spreads out evenly across the entire surface thereof and the solvent, which serves as the carrier, is then permitted to dry.

The carrier plate is then transferred from the spinning device to a hot plate where the wax is heated to a predetermined temperature at which it becomes somewhat tacky. This heating operation also drives out any solvent which remains in the wax layer.

After the wax has been brought to the desired mounting temperature, the wafers can be placed upon the wax surface by means of a vacuum pencil. In essence, it can be seen that after the wax has been brought to this temperature the upper surface of the wax provides a new reference plane which is substantially parallel to the original upper surface of the carrier plate.

After all of the wafer slices have been suitably positioned on the wax reference surface, the various wafers are placed under a pressure within the range of 1 to 50 lbs. per square inch and preferably in the range of 8 to 12 p.s.i. to force any dust particles present into the wax layer and to insure intimate contact of the underside of the wafers with the wax coating. The supporting carrier plate is then permitted to cool to room temperature.

The wax layer is sufficiently thick so that any dust particles present will have been pressed down and embedded in the viscous wax. If desired, the excess wax can then be removed from the carrier plate by a suitable solvent. A relatively poor solvent for the wax is chosen so that some physical scrubbing with a brush is necessary to remove the wax. This type of wax removal process is unique in that it does not undercut the wafer edge and will not remove any wax which is in registration with the wafer slice. At this point, mounting of the slices has been completed and each of the wafer slices is bonded to the solidified wax surface which forms a new reference surface, the latter being substantially parallel to the original surface of the carrier plate. Furthermore, all of the wafer slices are now located at the same distance from the carrier plate for the treating.

The mounted wafers are next subjected to a lapping operation where a flat, rotating metal plate charged with an abrasive slurry is brought into contact with the wafer surfaces. Typically, about 1.5 mils of silicon is removed from the slice surface by this wet abrasive grinding operation. Thereafter, the wafer surfaces are cleaned, generally with detergent and water, to remove the lapping abrasive. Thereafter, the wafer surfaces are subjected to a polishing operation, which is performed by contacting the wafer surfaces with a rotating metal plate covered with a cloth polishing pad impregnated with a polishing agent such as an aqueous silica sol containing 30–50% $SiO_2$. Typically, about 1.0 mil of silicon is removed in this step.

Detailed description

Referring now in more detail and by reference characters to the drawings, FIGURE 1 is an enlarged vertical elevational view of a wafer support plate 1 or so-called "carrier plate" with a plurality of semiconductor wafer slices 2, 3, 4, 5 and 6 mounted thereon in accordance with the prior art method. By further reference to FIGURE 1, it can be seen that the wafer support plate 1 is provided with a series of localized wax coatings 7 on its upper surface for mounting each of the wafer slices 2, 3, 4, 5 and 6. These various wafer slices 2, 3, 4, 5 and 6 illustrate the problems encountered in mounting wafer slices in accordance with the prior art methods.

In the prior art method of mounting the wafers, the supporting plate was heated to a temperature where a suitable adhesive wax could be melted thereon. The wax was applied by merely placing small amounts thereof on the surface of the carrier plate in the areas where it was desired to mount a semi-conductor wafer. The wax was melted to a liquid or semi-liquid condition and the wafer was placed in this pool of wax. The wafer was then pressed down to cause the wax to spread out and to be essentially urged out from the undersurface of the wafer so that a very thin wax layer was created. This layer was only sufficiently thick in order to temporarily affix the wafer to the surface of the carrier plate.

The wafer 2, as illustrated in FIGURE 1, is the ideal condition where the wax contains no particulate inclusions permitting close and uniform approach of the wafer to the carrier reference surface. The wafer slice 3 is illustrated as being disposed over a dust particle or similar foreign particle. The dust particle supports the wafer 3 at one side so that the wafer 3 is tilted with respect to the carrier plate 1. The wafer 4 is illustrated as being disposed over a foreign particle larger than the one under wafer 3 so that it is tilted even further with respect to the reference surface of the carrier plate. The wafer 5 is illustrated as being disposed over two large dust particles thus, it is spaced at a greater average distance from the reference surface than wafers 3 and 4.

Since all of the mounted slices will be lapped and polished until their top surfaces are coplanar and essentially parallel to the carrier reference surface, it is obvious that thickness variation in the final polished slices will result from the problems illustrated here. For example, wafer 3, when demounted after lapping and polishing will be found to be tapered in thickness from one side to the other. Similarly, wafer 4 will have a greater taper than wafer 3 and also will have a smaller average thickness. Wafer 5 will be thinner than wafer 3 or wafer 4 and wafer 2 will be thicker than wafers 3, 4, or 5. The wafer 6 is also illustrated as being disposed over a foreign particle. This condition results in indentations or so-called "dimples" in the final polished surface and is very undesirable since it destroys the surface flatness of the wafer.

The present invention is designed to overcome the deficiencies previously described and illustrated in FIGURE 1. Referring now in more detail and by reference characters to FIGURE 2 of the drawings, it can be seen that the present invention also provides a carrier plate 10. A suitable wax, which is to be used as the supporting surface, is dissolved in a suitable solvent and this dissolved wax is then poured on the carrier plate 10 while the same is rotating to form a substantially uniform wax coating 11 having a reference surface 12, the latter being substantially parallel to the upper surface of the plate 10.

There are a number of waxes which can be used in the process of the present invention and include the general categories of animal waxes, mineral waxes and vegetable waxes. Some of the vegetable waxes which are useful in the present invention are carnauba wax, gum dammar, gum mastic, ouricury wax, palm wax, raffia wax, which is a wax of the palm group, and candelilla wax. Some of the animal waxes which can be used in the present invention are spermaceti wax, bees wax, shellac wax and wool wax. Many of the mineral waxes are also useful, such as montane wax, which is a bituminous wax occurring in brown coals. Similarly, ozocoerite, which is a hydrocarbon wax is useful in the present invention. Furthermore, a number of the synthetic waxes, which have been developed in recent years, are useful in the present invention. Some of the synthetic waxes which can be employed are esters of polyhydricalcohols, such as esterified ethylene glycol, diethylene glycol, polyethylene glycol or sorbitol. It is also possible to use many wax blends in the present invention.

However, of the number of waxes thus available for use in the present invention, the natural resins, such as gum rosin, burgundy pitch, and related materials have been found to be the most suitable. Also useful in the present invention is processed tar, which is available as a wax. A number of the synthetic chlorinated polyphenyls are also very suitable for use in the present invention. The wax selected may be dissolved in a rapidly drying solvent. The wax must have a broad softening range and must be capable of being applied in a uniform relatively thick layer.

A number of commercially available solvents are useful in the present invention and some of the most suitable are acetone, toluene, chloroform and methylene chloride. Trichloroethylene has been found to be one of the most suitable of the solvents for use in the present invention, since it is a good solvent for many types of waxes and is capable of being rapidly evaporated when subjected to air drying. Furthermore, trichloroethylene is not flammable. However, many of the presently available alcohols and various aliphatic or aromatic solvents, such as xylene and hexane can also be used in the present invention. Many of the ketones, such as acetone described above are also useful solvents in the present invention.

The wax coating 11, which is deposited on the rotating plate 10, should be at least 0.2 mil thick and preferably have a thickness of approximately 1 mil. Generally, the preferred range of thickness is from 0.7 to 1.2 mils. Generally, the most effective results have been obtained when the minimum thickness of the coating is no less than 0.20 mil and no greater than 3.0 mils. The minimum thickness is only limited by the size of the foreign particles which may be encountered. Problems caused by particulate contamination will increase as the thickness of the layer decreases. Accordingly, dust particles will create more of a disturbing effect when the thickness of the layer is small. However, when the thickness of the layer is increased beyond about 3.0 mils, the thickness uniformity of the wax layer suffers. When a coating with a thickness of approximately 1 mil has been employed, it has been found that the wax thickness is uniform across the plate within $\pm 0.02$ mil. It has also been found that a thickness of approximately 1 mil for the coating 11 is generally greater than the overall dimension of any normally encountered foreign particles such as dust particles. The dust particles are generally 0.2 to 0.4 mil thick and, therefore, can be forced downwardly within the wax coating. This type of procedure does not eliminate the dust particles, which for all practical purposes are uneliminatable, but it does render the dust particles and similar foreign particles substantially harmless.

The amount of solvent selected is naturally a function of the wax employed and of the speed of rotation of the plate 10. Generally, the plate 10 is rotated at approximately 100–300 revolutions per minute. The wax solution is poured onto the center of the plate 10, where it immediately spins out into a uniform thin film. Within 5–10 seconds most of the volatile solvent evaporates leaving a relatively firm wax coating 11 on the plate. However, the thickness of the coating 11 will be a function of the viscosity of the solution and the speed of rotation. The excess wax solution will spin off of the peripheral margins of the carrier plate 10 during the rotation thereof. The remaining wax on the plate will spread out evenly to give a coating of uniform thickness. An additional thirty seconds should then be allowed to permit most of the solvent to evaporate. However, it has been found that after approximately ten seconds the greater portion of the solvent has evaporated and the wax is relatively hard. With regard to the speed of rotation of the plate 10, the speed should be not less than 100 revolutions per minute since a speed of rotation of less than 100 revolutions per minute will not provide a sufficiently uniform distribution of wax across the entire surface of the plate 10. Furthermore, it has been found that 500 revolutions per minute is a suitable maximum limit since at speeds greater than 500 revolutions per minute it is very difficult to generate wax films of sufficient thickness to be useful for slice mounting.

Figure 10:
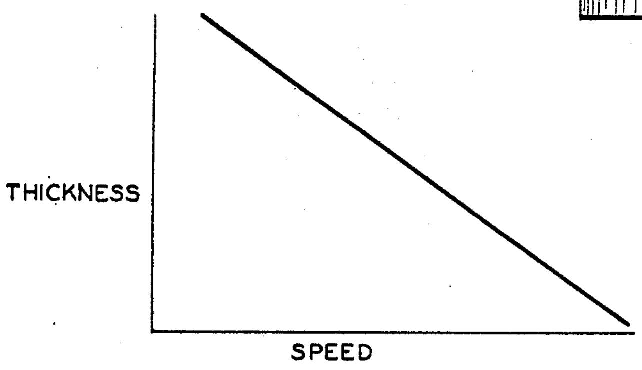
FIGURE 10 is a graph showing the plot of the speed of rotation of the wafer support plate as a function of the thickness of the wax film created.
Figure 11:
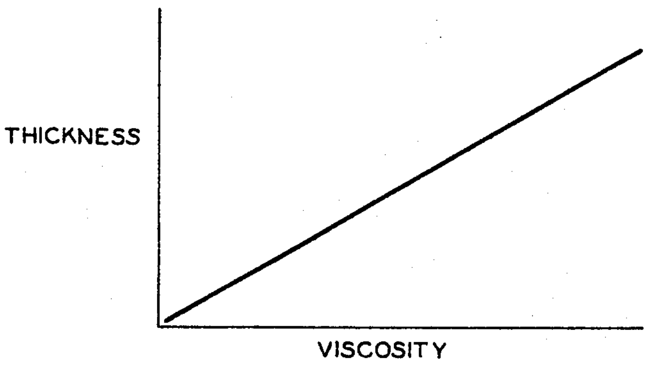
FIGURE 11 is a graph showing the plot of the thickness of the film as a function of the viscosity of the wax solution.

The wax thickness is also a function of the viscosity of the wax solution which depends on the particular solvent and wax concentrations used. These relationships are shown in FIGURES 10 and 11. FIGURE 10 illustrates a plot of the thickness of the wax film created as a function of the speed of rotation of the plate. In similar manner, FIGURE 11 illustrates a plot of the thickness of the film as a function of the viscosity of the wax solution. It can be seen that if the speed is reduced, then the viscosity of the solution must also be reduced in order to obtain the same thickness.

The carrier plate 10 is next transferred to a suitable heater 13, substantially as illustrated in FIGURE 3, where the wax is permitted to air dry and heated to the mounting temperature. The mounting temperature is selected to give a wax viscosity in the range of 4000 to 20,000 poise, a preferred range being 8,000 to 12,000 poise. For gum resin or modified resins this temperature is usually in the range of 190° to 220° F. If the temperature of the wax is too low, the wax is not sufficiently tacky to permit bonding to the semiconductor wafer. On the other hand, if the wax is heated to a temperature which is too high, it becomes too soft and begins to flow when the wafer is pressed onto the wax surface.

After the carrier plate 10 and the wax coating 11 has been brought to the desired mounting temperature, various semiconductor wafers 14 can be deposited on the upper surface 12 of the wax coating 11. This may be conveniently performed with a vacuum pencil in order to eliminate any contact of the wafer 14 with the hands of the operator in the manner as illustrated in FIGURE 4. The wafers are then placed on the surface 12 in any desired position, such as by use of a vacuum pencil as illustrated in FIGURE 4.

The carrier plate is next transferred to a press 25, which has a supporting frame 26 and a pressure plate 27, the latter being vertically disposed above the supporting frame 26 in the manner as illustrated in FIGURE 5. The pressure plate 27 is adapted to shift vertically with respect to the stationary supporting frame 26 and engage the upper surfaces of the wafer 14. The pressure plate 27 is provided with a somewhat rigid but yet sufficiently flexible rubber pad 28, which is adapted to engage the upwardly presented surface of the wafers 14 in the manner as illustrated in FIGURE 7. The resiliency of the rubber pad 28 compensates for slight thickness variations of the starting wafers 14 and applies substantially uniform pressure on each wafer.

In this manner, the pressure plate 27 lightly forces each of the wafers into intimate contact with the wax coating 11. The wafers are not embedded into the wax coating 11 but rather are actually bonded to the surface thereof. Inasmuch as the thickness of the wax coating 11 is substantially greater than the thickness of any foreign particles, such as any dust particles, the dust particles will be forced downwardly into the wax coating 11 where they will not in any way, interfere with the mounting of the wafers 14. It is also to be noted that the pressure from the pressure plate 27 is applied evenly across the upper surfaces of the wafers, so that the wafers are not damaged during the pressing operation. Furthermore, the pad 28 will allow for any high spots or ridges present in the surfaces of the wafers 14. However, since the foreign particle is generally very small, the pressure per unit area acting upon the particle is much greater than the pressure per unit area acting on the wafer 14 and accordingly, the particle will be easily forced downwardly into the wax coating 11. It has been found that pressures ranging from 4 to 20 p.s.i. as applied to the wafers 14 produce suitable results and are in the preferred pressure range. After pressing for about fifteen seconds, the pressure plate 27 is raised and the carrier plate is removed and allowed to cool to room temperature. The wafers are now firmly bonded to the hard wax surface.

The portion of the wax coating 11 not used for slice mounting may be removed if desired by means of a suitable solvent, such as isopropyl alcohol. A relatively poor solvent is deliberately chosen for this step so that some mechanical scrubbing action is also required to remove the wax. The solvent can be just merely poured onto the upper surface of the plate 10 with the wafers 14 disposed thereon. A small brush 29, similar to a surgical brush, is then used to physically scrub the wax from the surface of the plate in the manner as illustrated in FIGURE 6. Inasmuch as the wafers 14 are firmly bonded to the wax coating, they are not disturbed by this scrubbing operation. Furthermore, this scrubbing operation does not undercut the wafers 14; that is remove any of the wax disposed immediately beneath the wafer 14. When the scrubbing operation has been completed, the coating 11 disposed beneath the wafer is in complete marginal registration with the wafer 14 disposed thereon and firmly bonded thereto.

The wafer support plate 10 is then transferred to a lapping machine which is schematically illustrated in FIGURE 7. The lapping machine generally comprises a base 31 having a rotating lapping plate 32, the latter having a flat upper lapping surface 33. The wafer support plate 10 is oriented in an upside down position as illustrated in FIGURE 7 so that the exposed surfaces of the wafers 14 are in engagement with the lapping surface 33. An abrasive slurry consisting of an aqueous suspension of approximately 12 micron particle size aluminum oxide is fed to the lapping plate 32 by means of a feed pipe 34. A bracket 35 is secured to the base 31 and has a pair of arms 36 terminating in bearings engaging the wafer support plate 10. The lapping plate 32 is rotated with respect to the base 31 and its engagement with the wafers on the support plate 10 will cause rotation thereof about the support bearings on the arm 36. However, the wafer support plate 10 will not rotate with the lapping plate 32, but only with respect to the plate 32. In the lapping operation, approximately 1.5 mils is abraded from the upper surface of each of the wafers 14.

Figure 8:
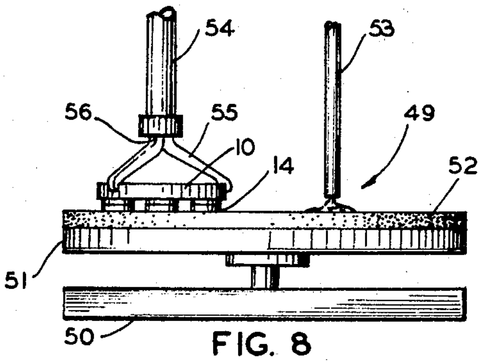
FIGURE 8 is a schematic side elevational view of a conventional polishing device and illustrating the method of polishing the wafers of the present invention.

After the lapping operation, the carrier plate 10 is cleaned by scrubbing with detergent and water to remove all traces of lapping abrasive. Thereafter, the wafer support plate 10 is next transferred to a polishing machine 49 as illustrated in FIGURE 8. The polishing machine is somewhat similar to the lapping machine and generally comprises a base 50 having a rotating polishing plate 51 having a flat upper surface which is covered with a suitable cloth polishing pad 52. The wafer support plate 10 is oriented in an upside-down position as shown in FIGURE 8 so that the exposed surfaces of the wafers 14 are in engagement with the polishing surface of the pad 52. A suitable polishing compound such as an aqueous silica sol is charged to the polishing plate 51 through a feed pipe 53. The wafer support plate is retained by means of an arm 54 having a plurality of outwardly extending fingers 55 which engage the edge of the plate 10. The fingers 55 are, in essence, secured to an extension 56 which is rotatably mounted on the arm 54. Through this construction, the polishing plate 51 is rotatable with respect to the base 50 and furthermore, causes rotation of the wafer support plate 10 about its own center. However, the wafer support plate 10 is rotating with respect to the base 50 and is rotatable with respect to the polishing plate 51 but is not revolving about the axis of rotation of the plate 51.

Figure 9:
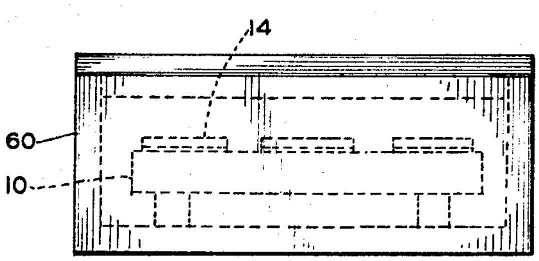
FIGURE 9 is a schematic side elevational view of a cooling chamber illustrating the method of cooling the wafer support plate in preparation for removing the wafer slices therefrom.

After the polishing operation, the wafer support plate 10 is next transferred to a cooling chamber 60, as illustrated in FIGURE 9, where it is cooled to a temperature within the range of 10° C. to −20° C. Differential contraction during cooling results in weakening or actually breaking of the bond between the wafers and the wax. The wafer support plate 10 is then removed from the chamber 60 where the wafers are lifted from the wax coating 11. It is also possible to slip a sharp implement, such as a razor blade, under the wafer 14 permitting the same to be urged upwardly from the wax coating.

There are many materials in the form of wafers capable of being prepared in accordance with the present invention. These include silicon and germanium crystals; compound semi-conductors of III–V series comprising phosphides, arsenides, and antimonides of gallium and indium; compound semi-conductors of the II–VI series comprising sulfides, selenides, and tellurides of zinc, cadmium and mercury; compound semi-conductors of the I–VII series comprising fluorides, chlorides, bromides and iodides of copper, silver, and gold; and various organic compounds useful as semi-conductor materials such as anthracene; metal phthalocyanines, especially copper phthalocyanine and zinc phthalocyanine; polyphthalocyanines; metal polyphthalocyanines, especially copper polyphthalocyanine; and chloroanyldurenediamine type complexes.

The invention is further illustrated by but not limited to the following examples.

Example 1

This example illustrates the results achieved by the standard mounting technique of the prior art. In this technique, the carrier was heated to about 300–325° F. which is well above the softening range of the wax which consisted of gum rosin containing 5% by weight of paraffin wax. A wax stick was applied to the hot surface of the carrier to generate a number of molten wax pools. A silicon slice was placed on each wax pool and swirled with a cotton swab to distribute the wax under the slice. The slices were then pressed evenly to squeeze excess wax from beneath the slices and the carrier was cooled.

In order to determine the wax thickness uniformity, a number of measurements were made of the starting slice thickness and the final thickness of slice plus wax layer after mounting. The results of 574 such measurements showed an average wax thickness of 0.45 mil with a standard deviation of 0.15 mil.

Example 2

This example illustrates the greatly improved wax thickness uniformity and the resulting excellent wafer thickness uniformity achieved by the "spin" mounting technique of the present invention.

The wax composition used was the same as that of Example 1. The wax was dissolved in trichloroethylene to form a solution containing approximately 34% solids. About 7.5 milliliter of wax solution was poured onto the center of an 8" diameter stainless steel carrier plate rotating at approximately 163 revolutions per minute. After air drying for 30 seconds, the carrier plate was transferred to a hot plate and heated to a temperature of approximately 210° F.

A series of 23 silicon slices of 1.25" diameter were then placed on the plate and were firmly pressed into the wax coating at a pressure of 10 pounds per square inch of slice surface for 15 seconds. Thereafter, the plate was permitted to cool and the excess wax around each of the wafers was removed by scrubbing with a small brush and isopropyl alcohol solvent. The thickness of each slice was measured before mounting and the wax plus slice thicknesses were measured after mounting on the carrier. Approximately 1 mil of material was then removed from each slice by lapping with 12μ $Al_2O_3$ on a 24" lapping machine. The slice plus wax thicknesses were again measured. Finally, the slices were demounted and cleaned and the final thickness was again measured at four points on the slice. The data set forth in Table 1 below was obtained at a result of this wafer slice mounting technique.

TABLE 1

| (1) Slice Number | (2) Raw Slice Thickness (Mils) | (3) After Mounting (Mils) | (4) Wax Thickness $\Delta_1=(3)-(2)$ (Mils) | (5) Thickness After Lapping (Mils) | (6) Wax $\Delta=(5)-(7)$ (Mils) |
|---|---|---|---|---|---|
| Outer Row: | | | | | |
| 1 | 12.00 | 12.78 | .78 | 11.75 | .75 |
| 2 | 12.04 | 12.78 | .74 | 11.78 | .73 |
| 3 | 12.02 | 12.79 | .77 | 11.79 | .78 |
| 4 | 12.04 | 12.79 | .75 | 11.80 | .72 |
| 5 | 12.00 | 12.77 | .77 | 11.80 | .75 |
| 6 | 12.09 | 12.85 | .74 | 11.79 | .76 |
| 7 | 12.00 | 12.75 | .75 | 11.77 | .74 |
| 8 | 12.02 | 12.78 | .76 | 11.74 | .74 |
| 9 | 12.01 | 12.78 | .77 | 11.72 | .74 |
| 10 | 12.01 | 12.78 | .77 | 11.71 | .74 |
| 11 | 12.01 | 12.72 | .71 | 11.69 | .71 |
| 12 | 12.06 | 12.78 | .72 | 11.69 | .72 |
| 13 | 12.05 | 12.75 | .70 | 11.69 | .69 |
| 14 | 12.02 | 12.75 | .73 | 11.69 | .71 |
| 15 | 12.00 | 12.72 | .72 | 11.71 | .71 |
| Inner Row: | | | | | |
| 16 | 12.01 | 12.78 | .77 | 11.72 | .74 |
| 17 | 12.01 | 12.77 | .76 | 11.76 | .74 |
| 18 | 12.02 | 12.80 | .78 | 11.76 | .76 |
| 19 | 12.05 | 12.80 | .75 | 11.74 | .74 |
| 20 | 12.06 | 12.78 | .72 | 11.71 | .70 |
| 21 | 12.01 | 12.75 | .74 | 11.70 | .73 |
| 22 | 12.07 | 12.81 | .74 | 11.59 | .73 |
| 23 | 12.01 | 12.79 | .78 | 11.71 | .76 |
| Σ | 276.61 | 293.85 | | 269.99 | |
| Mean | 12.03 | 12.78 | .75 | 11.73 | .73 |
| Range | .09 | .13 | .08 | .11 | .09 |

TABLE 1—Continued

| | (7) | (8) | (9) | (10) | (11) |
|---|---|---|---|---|---|
| | Slice Thickness After Demounting | | | | |
| Slice Number | (Mils) | (Mils) | (Mils) | (Mils) | Taper (Mils) |
| Outer Row: | | | | | |
| 1 | 11.00 | 10.99 | 11.00 | 11.01 | .02 |
| 2 | 11.05 | 11.06 | 11.02 | 11.02 | .04 |
| 3 | 11.01 | 10.93 | 11.01 | 10.99 | .08 |
| 4 | 11.08 | 11.03 | 11.03 | 11.03 | .00 |
| 5 | 11.05 | 11.03 | 11.05 | 11.01 | .04 |
| 6 | 11.03 | 11.05 | 11.04 | 11.03 | .02 |
| 7 | 11.03 | 10.92 | 11.01 | 10.96 | .09 |
| 8 | 11.00 | 10.98 | 10.95 | 10.95 | .03 |
| 9 | 10.98 | 10.98 | 10.96 | 10.99 | .03 |
| 10 | 10.97 | 10.94 | 10.98 | 10.98 | .04 |
| 11 | 10.98 | 10.97 | 10.99 | 11.01 | .04 |
| 12 | 10.97 | 10.92 | 10.94 | 10.97 | .05 |
| 13 | 11.00 | 11.02 | 10.96 | 10.94 | .06 |
| 14 | 10.98 | 10.91 | 11.02 | 11.00 | .11 |
| 15 | 11.00 | 10.95 | 10.94 | 10.96 | .02 |
| Inner Row: | | | | | |
| 16 | 10.98 | 10.97 | 10.94 | 10.96 | .03 |
| 17 | 11.02 | 11.02 | 11.09 | 11.05 | .07 |
| 18 | 11.00 | 11.06 | 11.03 | 11.01 | .05 |
| 19 | 11.00 | 11.04 | 10.98 | 11.00 | .06 |
| 20 | 11.01 | 10.94 | 11.01 | 11.01 | .07 |
| 21 | 10.97 | 10.96 | 10.96 | 10.92 | .04 |
| 22 | 10.94 | 11.00 | 10.96 | 10.95 | .05 |
| 23 | 10.95 | 10.95 | 11.03 | 10.96 | .08 |
| Sum | 253.00 | | | | 1.12 |
| Mean | 11.00 | | | | 0.048 |
| Range | 0.14 | | | | 0.11 |

In the above table, column No. 4, which represents the wax thickness, is the difference between the data of column 2 and column 3. Column 6 gives a second independent estimate of wax thickness obtained as the difference between the data of column 5 and column 7. Column 7 further represents the final lapped wafer center thickness, columns 8, 9 and 10 represent thickness measurements made at three points ⅛" from the edge of the wafer and 120° apart from each other. The taper represented in column 11 is the maximum difference of columns 8, 9 and 10.

The average wax thickness was found to be 0.74 mil with a standard deviation of 0.02 mil. This standard deviation is approximately the same as that of the measurement method used.

The following table compares the distribution of wax thicknesses expected from the standard mounting procedure of the prior art with that expected from the improved technique of this invention.

| | Maximum Wax Thickness Variation, Mils | |
|---|---|---|
| | Prior Art Technique | Spin Mounting Technique |
| Percent of Slices: | | |
| 68 | ±.15 | ±.02 |
| 95 | ±.30 | ±.04 |
| 99.7 | ±.45 | ±.06 |

These variations in wax thickness result directly in similar variations of final slice thickness after lapping and polishing.

It should be understood that changes and modifications in the form, construction, arrangement and combination of parts presently described and pointed out may be made and substituted for those herein shown without departing from the nature and principle of my invention.

Having thus described my invention, what I desire to claim and secure by Letters Patent is:

1. The method of processing semiconductor slices on a carrier, said method comprising dissolving a quantity of wax in a volatile solvent to form a wax-solvent solution, applying said wax-solvent solution to said carrier and simultaneously rotating said carrier at a speed sufficient to cause said solution to spread uniformly over the entire surface of said carrier, permitting said solvent to evaporate and said wax to dry thereby forming a wax layer, heating said wax layer to a temperature where it is sufficiently fluid to yield to dust particles and sufficiently viscous to support the weight of a semiconductor slice placed thereon, and pressing said slice on said wax layer so that dust particles will be forced into the wax layer and causing said slice to temporarily bond to the wax layer.

2. The method of claim 1 where the wax is applied in sufficient quantity uniformly across the carrier surface so that the wax layer is thicker than dust particles.

3. The method of claim 1 where the wax is applied in sufficient quantity uniformly across the carrier surface so that the wax layer is thicker than 0.4 mil.

4. The method of claim 1 where the wax is applied in sufficient quantity uniformly across the carrier surface so that the wax layer has a thickness within the range of 0.7–1.2 mil.

5. The method of claim 1 further characterized in that a solvent is applied to the surface of the wax layer to dissolve excess wax.

6. The method of claim 1 further characterized in that a solvent is applied to the surface of the wax layer to dissolve excess wax and the excess wax surrounding each of the slices is scrubbed off of the carrier in the presence of the solvent.

7. The method of claim 1 further characterized in that the method comprises lapping the slices after they are bonded to the wax layer.

8. The method of claim 1 further characterized in that the method comprises lapping the slices after they are bonded to the wax layer, and washing the slices after they are lapped.

9. The method of claim 1 further characterized in that the method comprises lapping the slices after they are bonded to the wax layer, washing the slices after they are lapped, and polishing the slices after they are washed.

10. The method of claim 1 where the wax is applied in sufficient quantity uniformly across the carrier surface so that the wax layer has a thickness of approximately 1 mil.

11. The method of claim 1 further characterized in that a solvent is permitted to evaporate and the wax to air dry.

12. The method of processing semiconductor slices on a carrier, said method comprising applying a wax coating to said carrier and simultaneously rotating said carrier at a speed sufficient to cause said coating to spread uniformly over the surface of the carrier, heating said wax coating to a temperature where it is sufficiently fluid to yield to dust particles and sufficiently viscous to support the weight of a semiconductor slice placed thereon locating said slices in a desired pattern, bringing the wax coating of said carrier into contact with said slices, and pressing said slices on said wax coating so that said slices become temporarily bonded to the wax coating.

13. The method of forming a wax-like reference surface on a carrier plate having an exterior surface and used in processing of semiconductor slices, said method comprising applying a wax coating to the exterior surface of said carrier plate and simultaneously rotating said carrier plate at a speed sufficient to cause said coating to spread uniformly over the exterior surface of said carrier plate, permitting said wax coating to dry to form a reference surface spaced from and substantially parallel to the exterior surface of said carrier plate, said wax coating having a sufficient viscosity to enable a semiconductor slice having top and bottom planar walls to become temporarily adhered to said reference surface, and affixing said slice to said reference surface so that the top and bottom planar walls of said slice maintain a parallel position with respect to said exterior surface and said reference surface.

14. The method of forming a wax-like reference surface on a carrier plate having an exterior surface and used in processing of semiconductor slices, said method comprising dissolving a quantity of wax in a volatile solvent to form a wax-solvent solution, applying said wax-solvent solution to the exterior surface of said carrier plate and simultaneously rotating said carrier plate at a speed sufficient to cause said solution to spread uniformly over the entire exterior surface of said carrier plate, permitting said solvent to evaporate and said wax to dry to form a reference surface spaced from and substantially parallel to the exterior surface of said carrier plate, said wax having a sufficient viscosity to enable a semiconductor slice having top and bottom planar wall to become temporarily adhered to said reference surface, and affixing said slice to said reference surface so that the top and bottom planar walls of said slice maintain a parallel position with respect to said exterior surface and said reference surface.

15. The method of processing semiconductor slices on a carrier having an exterior surface, said method comprising applying a wax coating to the exterior surface of said carrier and simultaneously rotating said carrier at a speed sufficient to cause said coating to spread uniformly over the entire surface of said carrier, permitting said wax coating to dry to form a reference surface spaced from and substantially parallel to the exterior surface of said carrier, said wax coating being sufficiently fluid to yield to dust particles and sufficiently viscous to support the weight of a semiconductor slice having top and bottom planar walls placed thereon, and pressing said slice on said wax coating to cause said slice to temporarily adhere to the wax coating so that the top and bottom planar walls are substantially parallel with respect to said exterior surface and said reference surface.

References Cited

UNITED STATES PATENTS

| | | | |
|---|---|---|---|
| 1,284,283 | 11/1918 | Flad | 51—277 |
| 2,580,131 | 12/1951 | Rowell | 118—52 X |
| 2,620,284 | 12/1952 | MacWilliam | 117—105.4 X |
| 3,041,800 | 7/1962 | Heisel | 51—277 |
| 3,123,953 | 3/1964 | Merkl | 51—283 |
| 3,170,273 | 2/1965 | Walsh et al. | 51—281 |

LESTER M. SWINGLE, Primary Examiner

U.S. Cl. X.R.

51—277; 117—105.4; 118—52